United States Patent [19]
Gonzalez

[11] Patent Number: 5,880,637
[45] Date of Patent: Mar. 9, 1999

[54] LOW-POWER OPERATIONAL AMPLIFIER HAVING FAST SETTING TIME AND HIGH VOLTAGE GAIN SUITABLE FOR USE IN SAMPLED DATA SYSTEMS

[75] Inventor: David M. Gonzalez, Elgin, Ill.

[73] Assignee: Motorola, Inc., Schaumburg, Ill.

[21] Appl. No.: 851,437

[22] Filed: May 5, 1997

[51] Int. Cl.$^6$ .................................................. H03F 3/45
[52] U.S. Cl. ........................ 330/253; 330/255; 330/311
[58] Field of Search .................................. 330/253, 255, 330/311

[56] References Cited

U.S. PATENT DOCUMENTS

| | | | |
|---|---|---|---|
| 4,151,482 | 4/1979 | Robe | 330/308 |
| 4,284,959 | 8/1981 | Heagerty et al. | 330/253 |
| 5,015,966 | 5/1991 | McIntyre | 330/253 |
| 5,168,243 | 12/1992 | Feliz et al. | 330/252 |
| 5,257,286 | 10/1993 | Ray | 375/12 |
| 5,465,072 | 11/1995 | Atarodi | 330/311 X |
| 5,469,104 | 11/1995 | Smith et al. | 327/491 |
| 5,523,718 | 6/1996 | Butler | 330/255 |

OTHER PUBLICATIONS

Nakamura et al., "An Enhanced Fully Differential Folded–Cascode Op Amp", *IEEE Journal of Solid–State Circuits*, vol. 27, No. 4, Apr., 1992, pp. 563–568.

Banu et al., "Fully Differential Operational Amplifiers with Accurate Output Balancing", *IEEE Journal of Solid–State Circuits*, vol. 23, No. 6, Dec. 1988, pp. 1410–1414.

*Primary Examiner*—James B. Mullins
*Attorney, Agent, or Firm*—John G. Rauch

[57] ABSTRACT

An operational amplifier includes a differential amplifier including a first transistor (120) and a second transistor (122), a gain stage (125), a first folded cascode stage (104) and a second folded cascode stage 106, and a first telescopic stage (108) and a second telescopic stage (110). The folded cascode stages respond to current in the differential amplifier to control the output signal, and the telescopic stages respond to a differential voltage produced by the gain stage to control the output signal.

9 Claims, 2 Drawing Sheets

LOW-POWER OPERATIONAL AMPLIFIER HAVING FAST SETTING TIME AND HIGH VOLTAGE GAIN SUITABLE FOR USE IN SAMPLED DATA SYSTEMS

FIELD OF THE INVENTION

The present invention generally relates to operational amplifier circuits. More particularly, the present invention relates to high performance, low power operational amplifiers.

BACKGROUND OF THE INVENTION

Operational amplifiers have many applications in control and communication circuits. One particular application is in implementation of high performance integrators for sampled data systems.

Performance characteristics of operational amplifiers are chosen to optimize the operational amplifier's performance to its application. These characteristics include open loop voltage gain, settling time, common mode rejection, input and output impedance and input and output voltage swing. Modern systems typically operate at relatively low power supply voltages, such as 3 V rail to rail or less, and operational amplifiers need to operate at such voltages. Moreover, power dissipation in many circuits should always be minimized. For economical implementation, operational amplifiers should be relatively simple in design, requiring only small amounts of die area when included in an integrated circuit.

In sampled data systems, a particularly important performance characteristic is the settling time of the operational amplifier. The settling time is the time in which the output signal reaches a specified percentage (such as 0.024% for 12-bit resolution or 0.012% for 13 bit resolution) of its final value. The settling time in part establishes the maximum speed at which the operational amplifier can be operated. This in turn relates to the clock speed of a system with which the operational amplifier can be used.

Modern systems are being operated at higher clock speeds, creating needs for ever faster operational amplifiers. For example, in radio communication technology, the Global System for Mobile (GSM) communication standard is being extended from the 900 MHz frequency band to the 1.9 GHz band. At the same time, power dissipation requirements are growing more stringent and operating voltage for radios in such systems are being reduced to the 2–3 V range. Prior art operational amplifiers have not been able to meet these performance characteristics.

Accordingly, there is a need in the art for a low-power operational amplifier having fast settling time and high voltage gain suitable for use in sampled data systems.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

DETAILED DESCRIPTION OF A PREFERRED EMBODIMENT

Figure 1:
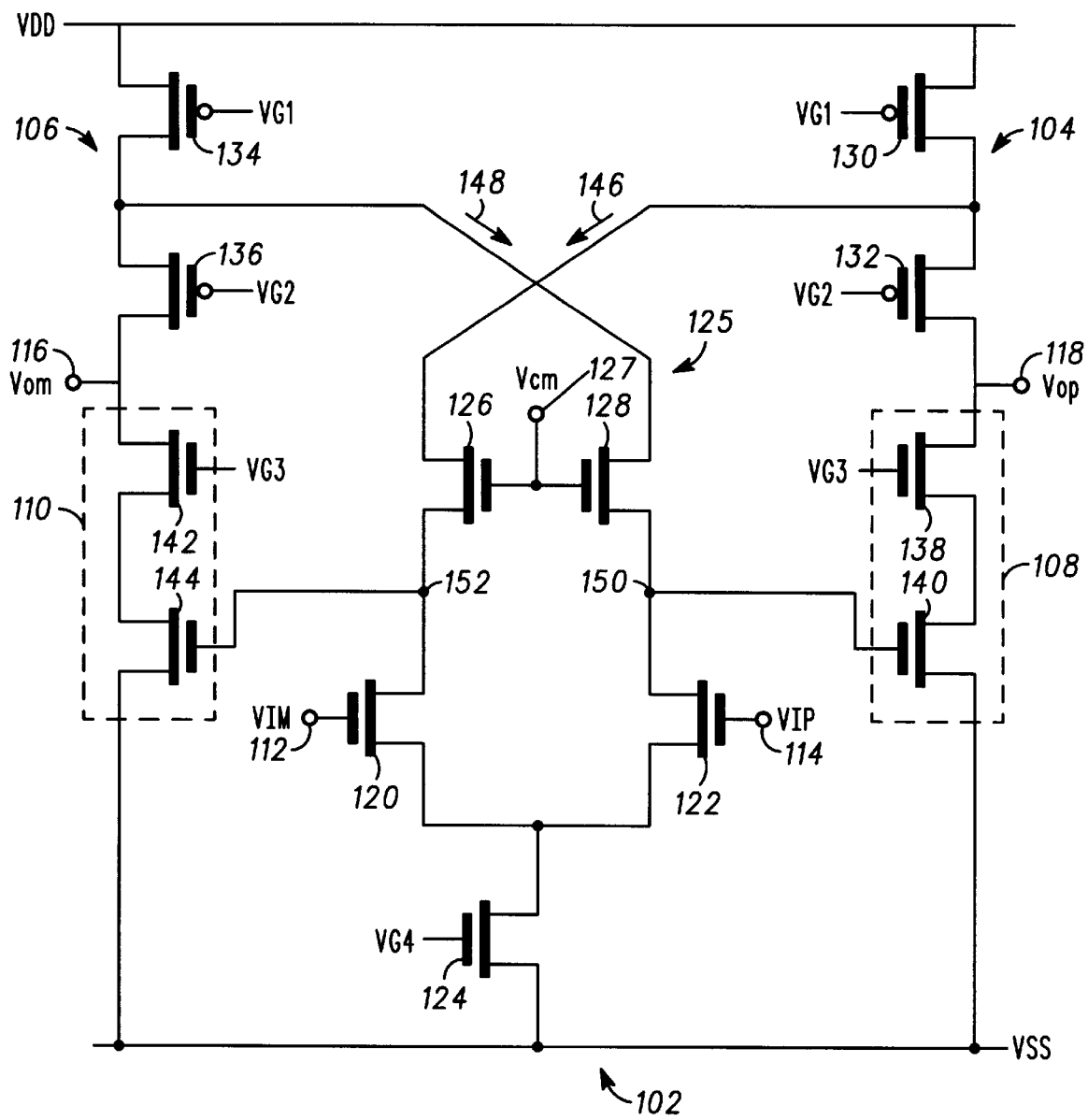
FIG. 1 is a schematic diagram of an operational amplifier in accordance with the present invention.

Referring now to FIG. 1, an operational amplifier 100 includes an input stage 102, a gain stage 125, and an output stage including a first folded cascode stage 104 and a second folded cascode stage 106, a first telescopic stage 108 and a second telescopic stage 110. The operational amplifier 100 receives power from a first power node $V_{DD}$ and a second power node $V_{SS}$. It is an advantage of the present invention that the operational amplifier 100 operates at an operating potential as low as approximately 2 V.

The operational amplifier 100 receives a differential input signal at a first input 112 and a second input 114. In FIG. 1, the first input 112 is labelled $V_{IM}$ and the second input 114 is labelled $V_{IP}$. The first input 112 and the second input 114 form a differential input. In response to the input signal, the operational amplifier 100 provides an output signal at a first output 116 and a second output 118. In FIG. 1, the first output 116 is labelled $V_{OM}$ and the second output 118 is labelled $V_{OP}$. The first output 116 and the second output 118 form a differential output.

The input stage 102 includes a differential amplifier including a first transistor 120, a second transistor 122 and a third transistor 124. In the illustrated embodiment, the first transistor 120, the second transistor 122 and the third transistor 124 are all N-channel metal-oxide-semiconductor (NMOS) transistors. The first transistor 120 has a drain coupled to a node 152. The second transistor 122 has a drain coupled to a node 150. The first transistor 120 has a gate coupled to the first input 112 and the second transistor 122 has a gate coupled to the second input 114 for receiving the differential input signal. The third transistor 124 has a drain coupled to the sources of the first transistor 120 and the second transistor 122 and a gate coupled to a reference potential, labelled $V_{G4}$ in FIG. 1. The third transistor 124 generates a relatively constant current in response to the reference potential. This current is steered between the first transistor 120 and the second transistor 122 in response to the differential input signal.

The gain stage 125 includes transistor 126 and transistor 128. Transistor 126 and transistor 128 are each configured as a common gate transistor. Transistor 126 is coupled in series with first transistor 120 and transistor 128 is coupled in series with second transistor 122. When the current from the current source is steered through a respective transistor of the differential amplifier, the input stage produces a differential current, which is the drain currents in first transistor 126 and second transistor 128. The gain stage produces a differential voltage in response to the differential current. The first transistor 120, second transistor 122 and third transistor 124 form an input stage which receives a differential input signal and produces a current and a voltage in response thereto.

The first folded cascode stage 104 includes transistor 126, a second transistor 130 and a third transistor 132. In the illustrated embodiment, the transistor 126 is a NMOS transistor and the second transistor 130 and the third transistor 132 are P-channel metal-oxide-semiconductor (PMOS) transistors. The transistor 126 has a source coupled to node 152, a gate coupled to a common mode feedback input 127 (labelled $V_{CM}$ in FIG. 1) and a drain coupled to the drain of the second transistor 130 and the source of the third transistor 132. The source of the second transistor 130 is coupled to $V_{DD}$ and the gate is coupled to a reference potential, labelled $V_{GI}$. The drain of the third transistor 132 is coupled to the second output 118 and the gate is coupled to a reference potential labelled $V_{G2}$. The second transistor 130 operates as a current source, supplying a substantially constant current to its drain in response to the reference potential $V_{G1}$. The third transistor 132 operates as an output transistor for providing output current to the second output 118. Thus, the first folded cascode stage 104 forms a first stage including a bias current generator for generating a bias current and an output transistor.

The second folded cascode stage 106 includes a transistor 128, a second transistor 134 and a third transistor 136. In the illustrated embodiment, the transistor 128 is a NMOS transistor and the second transistor 134 and the third transistor 136 are PMOS transistors. The transistor 128 has a source coupled to node 150, a gate coupled to a common mode feedback input 127 (labelled $V_{CM}$ in FIG. 1) and a drain coupled to the drain of the second transistor 134 and the source of the third transistor 136. The source of the second transistor 134 is coupled to $V_{DD}$ and the gate is coupled to a reference potential, labelled $V_{G1}$. The drain of the third transistor 136 is coupled to the first output 116 and the gate is coupled to a reference potential labelled $V_{G2}$. The second transistor 134 operates as a current source, supplying a substantially constant current to its drain in response to the reference potential $V_{G1}$. The third transistor 136 operates as an output transistor for providing output current to the first output 116. Thus, the second folded cascode stage 106 forms a first stage including a bias current generator for generating a bias current and an output transistor A folded cascode amplifier stage generally includes a first transistor and a second transistor. The first transistor operates as a common source amplifier, receiving signals at its gate. A second transistor of complementary conductivity type operate as a common gate amplifier having a reference potential applied at its gate and having its source coupled to the drain of the first transistor for receiving signal current. Quiescent operating current is supplied to the drain of the first transistor and the source of the second transistor. The primary conduction paths are in series for conducting signal currents but are in parallel for conducting quiescent current.

The first telescopic stage 108 includes a first transistor 138 and a second transistor 140. The drain of the first transistor 138 is coupled to the second output 118 and the gate is coupled to a reference potential labelled $V_{G3}$. The second transistor 140 has a drain coupled to the source of the first transistor 138, a gate coupled to node 150 and a source coupled to $V_{SS}$.

The second telescopic stage 110 includes a first transistor 142 and a second transistor 144. The drain of the first transistor 142 is coupled to the first output 116 and the gate is coupled to a reference potential labelled $V_{G3}$. The second transistor 144 has a drain coupled to the source of the first transistor 142, a gate coupled to node 152 and a source coupled to $V_{SS}$. A telescopic amplifier stage is also known as a cascode stage.

A telescopic or cascode amplifier stage generally include a first and a second transistor. The first transistor operates as a common source amplifier having its drain connected to the source of the second transistor, which operates as a common gate amplifier. Signals are applied to the gate of the first transistor while a reference potential is applied to the gate of the second transistor. Output signals are available at the drain of the second transistor.

In operation, when the input signal applied to the first input 112 and the second input 114 has a first polarity such that the voltage at the first input 112 has a positive potential relative to the voltage at the second input 114, the current generated by the current source formed by third transistor 124 is steered through the first transistor 120 and away from the second transistor 122. The transistor 126 and the transistor 128 operate as load devices for the differential pair, first transistor 120 and second transistor 122, respectively. The common mode feedback input 127 is biased so that the average of the two output voltages is maintained midway between $V_{SS}$ and $V_{DD}$.

The current steered through the first transistor 120 is also conducted through transistor 126. To supply this current to the transistor 126, current from the current source formed by second transistor 130 is diverted away from the third transistor 132. The diverted current is indicated by arrow 146 in FIG. 1. This causes the output voltage at the second output 118 to fall.

Since the current from the third transistor 124 is steered away from the second transistor 122, the current through second transistor 122 and transistor 128 is reduced. Reduced current in the transistor 128 causes the current from the current source formed by second transistor 134 to be directed to the third transistor 136. This current is available to charge any capacitive load coupled to the first output 116 and pull the first output 116 to a high voltage level. Thus, the first folded cascode stage 104 and the second folded cascode stage 106 form a first stage or first output stage which controls an output signal in response to the current in the differential amplifier.

When the input signal applied to the first input 112 and the second input 114 has a second polarity such that the voltage at the first input 112 has a negative potential relative to the voltage at the second input 114, the current generated by third transistor 124 is steered through the second transistor 122 and away from the first transistor 120. This current is conducted by the transistor 128 and is supplied by the current source formed by second transistor 134. This current is indicated by arrow 148 in FIG. 1. This causes the voltage at the first output 116 to fall. As current is steered away from first transistor 120 and series-coupled transistor 126, the current from the second transistor 130 current source is steered to the third transistor 132 and a high voltage level is provided to the first output 118. Thus, the folded cascode stages respond to a current output from the input stage to control the output signal at the differential output.

The telescopic stages respond to a voltage output from the input stage to control the output signal at the differential output. When the voltage at the first input 112 exceeds the voltage at the second input 114 the current steered through the transistor 126 causes a voltage drop across this transistor and the voltage at node 152 falls. This reduced voltage tends to turn off the second transistor 144, allowing the voltage at the first output 116 to rise. Complementary action occurs at the second output 118, where a rising voltage at node 150 turns on the second transistor 140, pulling down the voltage at the second output 118. Thus, the first telescopic stage 108 and the second telescopic stage 110 form a second stage or second output stage which controls the output signal in response to the voltage received from the input stage 102.

Prior art operational amplifiers using folded cascode stages provided only an active pull-down transistor at the output. Such an active pull-down transistor was biased at its gate with a reference potential. Its drain was connected to the output node and its source was connected to $V_{SS}$, similar to third transistor 124. When the differential current was steered from the folded cascode on the high voltage output side, the pull-down transistor discharged the output node and pulled the output voltage to a low voltage level.

In contrast, the operational amplifier in accordance with the present invention provides improved performance. The output stage of the amplifier includes a current mode stage responsive to the differential current for producing the differential output signal and a voltage mode stage responsive to the differential voltage for producing the differential output signal. The telescopic amplifier stages provide voltage gain which accelerates the response to switching transients. Use of the telescopic amplifier stages provides additional advantages, as well, because the bias currents set generated by the current sources formed by third transistor 124, second transistor 130 and second transistor 134 can be reduced in magnitude. Thus, overall power drain of the operational amplifier according to the present invention is reduced compared to prior art folded cascode designs. Since the currents are reduced, the transistors conveying this current, including first transistor 120, second transistor 122, third transistor 124, transistor 126, transistor 128, second transistor 130 and second transistor 134, can be reduced in size. This substantially reduces the die area required for implementing the operational amplifier.

Figure 2:
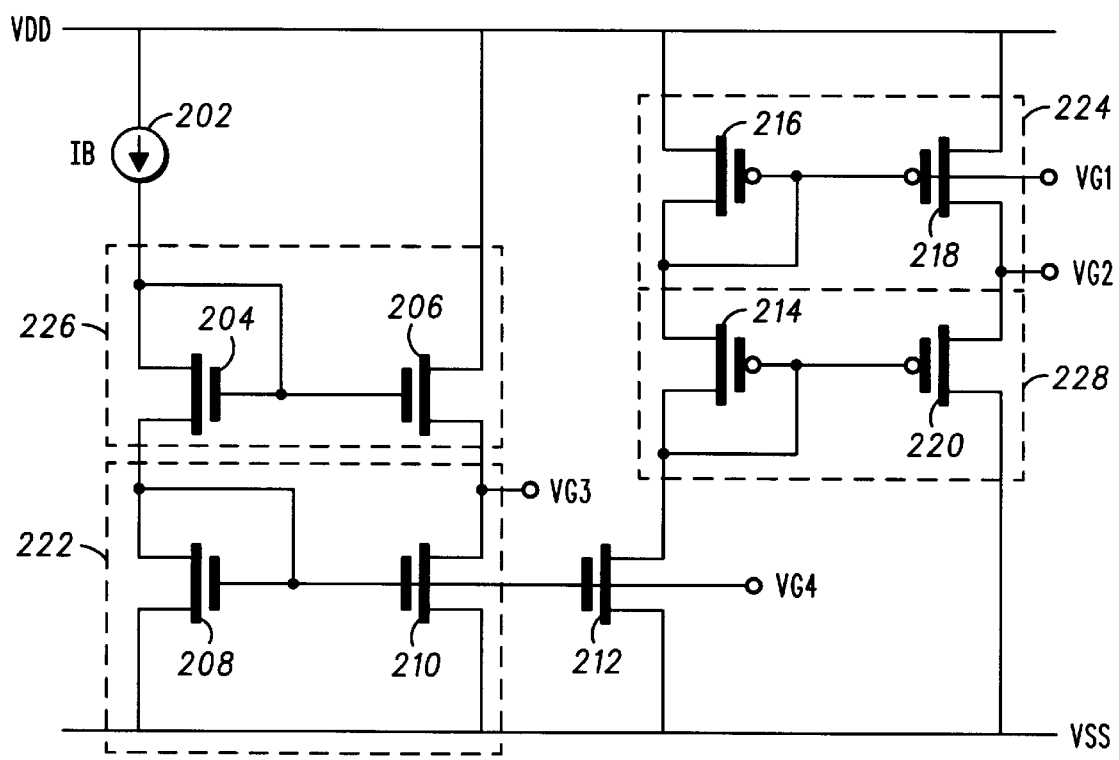
FIG. 2 is a schematic diagram of a circuit for biasing the operational amplifier of FIG. 1.

FIG. 2 is a schematic diagram of a circuit 200 for biasing the operational amplifier of FIG. 1. The circuit 200 includes a current source 202, a first current mirror 222, a second current mirror 224, a first level shifter 226 and a second level shifter 228. The circuit 200 is coupled between power and ground potentials at $V_{DD}$ and $V_{SS}$. The current source 202 produces a substantially constant current. The current source may be any suitable current source made up of typical components such as transistors, diodes and resistors.

The first current mirror 222 includes a transistor 208 and a transistor 210 sharing a common gate connection. The gate of the transistor 208 is connected to the drain of the transistor 208. The drain of the transistor 208 is coupled through the first level shifter to the current source 202. Thus, the transistor 208 conducts the substantially constant current from the current source 202. This substantially constant current is mirrored in the transistor 210.

The first level shifter includes transistor 204 and transistor 206. The gates of the transistor 204 and transistor 206 are coupled together and coupled to the drain of the transistor 204. As noted above, the substantially constant current from the current source 202 is conducted by the first level shifter, in the transistor 204. This substantially constant current is mirrored by transistor 210 and flows through transistor 206. The current in the transistor 206 produces a voltage drop between the gate of transistor 206 and the source of transistor 206, thus producing the reference potential $V_{G3}$. Preferably, $V_{G3}$ is established at a value substantially equal to $V_T + 2V_{Dsat}$, where $V_T$ is the threshold voltage of the transistor and $V_{Dsat}$ is the drain to source saturation voltage. This allows the voltage at the first output 116 and the second output 118 of the operational amplifier 100 (FIG. 1) to swing within $2V_{DSat}$ of $V_{DD}$ and $V_{SS}$.

The common gate connection of transistor 208 and transistor 210 in the first current mirror 222 is further coupled to the gate of transistor 212. Thus, the substantially constant current in the first current mirror 222 is mirrored in transistor 212 and made available at its drain. The common gate connection provides the reference potential $V_{G4}$.

The second current mirror 224 includes transistor 216 and transistor 218. Transistor 216 and transistor 218 have a common gate connection which is also coupled to the drain of transistor 216. This common gate connection produces the reference potential $V_{G1}$. Transistor 216 is coupled to the drain of transistor 212 through the second level shifter 228 to received the substantially constant current. This current is mirrored in transistor 218.

The second level shifter 228 includes transistor 214 and transistor 220. Their gates are coupled together and to the drain of transistor 214. As noted above, the second level shifter 228 conducts a substantially constant current from transistor 212 to the second current mirror 224. The current in transistor 220 produces a voltage drop between the source and gate of transistor 220, thereby producing the reference potential $V_{G2}$.

In operation, the substantially constant current produced by the current source 202 is mirrored throughout the circuit 200 and may be amplified or attenuated (for example, by adjusting transistor sizing) as necessary. In this manner, the circuit 200 produces the four reference potentials required by the operational amplifier 100 (FIG. 1). Preferably, the circuit 200 and the operational amplifier are fabricated on a single silicon die to minimize die area and maximize electrical performance.

As can be seen from the foregoing, the present invention provides an operational amplifier which includes a differential amplifier, a gain stage 125, a first folded cascode stage 104 and a second folded cascode stage 106, and a first telescopic stage 108 and a second telescopic stage 110. The folded cascode stages respond to current in the differential amplifier to control the output signal, and the telescopic stages respond to a differential voltage produced by the gain stage to control the output signal. Use of the folded cascode stages and the telescopic stages improves voltage gain and settling time of the operational amplifier and permits its use in conjunction with sampled data circuits operating communication circuits at frequency bandwidths up to 1.9 GHz While a particular embodiment of the present invention has been shown and described, modifications may be made. For example, bipolar junction transistors can be substituted for some or all of the NMOS and PMOS transistors shown in the drawing. Also, for example, the operational amplifier may be reconfigured for single ended rather than differential operation. It is therefore intended in the appended claims to cover all such changes and modifications which fall within the true spirit and scope of the invention.

What is claimed is:

1. An operational amplifier comprising:

an input stage which receives a differential input signal and produces a current and a voltage in response thereto, including a differential amplifier which receives the differential input signal and produces a differential current, and a gain stage which conveys the differential current to the first stage of the output stage and which produces the voltage; and an output stage coupled to the input stage and including a first stage which controls an output signal in response to the current and a telescopic stage which controls the output signal in response to the voltage.

2. An operational amplifier as recited in claim 1 wherein the first stage comprises a bias current generator for generating a bias current and an output transistor, the bias current being steered between the output transistor and the gain stage in response to the differential current.

3. An operational amplifier as recited in claim 2 wherein the gain stage comprises a common gate transistor coupled between the differential amplifier and the bias current generator, the common gate transistor conveying the bias current and the differential current.

4. An operational amplifier comprising:

an input stage configured to receive a differential input signal and produce a differential current;

a gain stage coupled to the input stage to produce a differential voltage in response to the differential current;

a first output stage coupled to the gain stage to receive the differential current, the first output stage controlling a differential output signal in response to the differential current; and a second, telescopic output stage coupled to the gain stage, the second output stage controlling the differential output signal in response to the differential voltage.

5. An operational amplifier comprising:

a differential amplifier including a first transistor and a second transistor configured to receive a differential input signal and produce a differential current;

a gain stage including a first gain transistor and a second gain transistor coupled in series with the first transistor and the second transistor of the differential amplifier, respectively, the first gain transistor and the second gain transistor producing a differential voltage in response to the differential current; and an output stage coupled to the gain stage for producing a differential output signal, the output stage including a current mode stage responsive to the differential current for producing the differential output signal and a telescopic amplifier stage responsive to the differential voltage for producing the differential output signal.

6. An operational amplifier as recited in claim 5 wherein the current mode stage comprises a first current mode transistor coupled between the first gain transistor and a second output and a second current mode transistor coupled between the second gain transistor and a first output.

7. An operational amplifier as recited in claim 6 wherein the current mode stage comprises a bias current generator for biasing the first gain transistor and the first current mode transistor and the second gain transistor and the second current mode transistor.

8. An operational amplifier as recited in claim 7 wherein the bias current generator generates a first bias current and a second bias current, each of the first bias current and the second bias current being steered between a respective gain transistor and a respective current mode transistor in response to the differential input signal.

9. An operational amplifier as recited in claim 5 wherein the telescopic amplifier stage comprises a common source transistor coupled to the gain stage and a bias transistor for providing output currents in response to the differential voltage.

* * * * *

UNITED STATES PATENT AND TRADEMARK OFFICE
CERTIFICATE OF CORRECTION

PATENT NO. : 5,880,637
DATED : March 9, 1999
INVENTOR(S) : Gonzalez

It is certified that error appears in the above-indentified patent and that said Letters Patent is hereby corrected as shown below:

On the title page, item [54] and Column 1:

In line 2, replace "FAST SETTING" with --FAST SETTLING--.

Signed and Sealed this

Sixth Day of July, 1999

Attest:

Q. TODD DICKINSON

*Attesting Officer*     *Acting Commissioner of Patents and Trademarks*